(12) United States Patent
Monga et al.

(10) Patent No.: US 11,996,854 B2
(45) Date of Patent: May 28, 2024

(54) METHOD AND SYSTEM FOR LOW NOISE SUB-SAMPLING PHASE LOCK LOOP (PLL) ARCHITECTURE WITH AUTOMATIC DYNAMIC FREQUENCY ACQUISITION

(71) Applicant: SAMSUNG ELECTRONICS CO., LTD., Suwon-si (KR)

(72) Inventors: Sushrant Monga, Karnataka (IN); Vishnu Kalyanamahadevi Gopalan Jawarlal, Karnataka (IN)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 17/895,393

(22) Filed: Aug. 25, 2022

(65) Prior Publication Data

US 2024/0007112 A1    Jan. 4, 2024

(30) Foreign Application Priority Data

Jun. 29, 2022  (IN) .............................. 202241037419

(51) Int. Cl.
*H03L 7/091*    (2006.01)
*H03L 7/089*    (2006.01)
*H03L 7/099*    (2006.01)

(52) U.S. Cl.
CPC ............ *H03L 7/091* (2013.01); *H03L 7/0891* (2013.01); *H03L 7/099* (2013.01)

(58) Field of Classification Search
CPC ........ H03L 7/091; H03L 7/0891; H03L 7/099
See application file for complete search history.

(56) References Cited

U.S. PATENT DOCUMENTS

| 6,463,112 B1 | 10/2002 | Hafez et al. |
| 6,542,039 B1 | 4/2003 | Ogura |
| 6,614,866 B2 | 9/2003 | Hafez et al. |

(Continued)

FOREIGN PATENT DOCUMENTS

CN    110798208 A    2/2020

OTHER PUBLICATIONS

Arvin R. Shahani et al., "Low-Power Dividerless Frequency Synthesis Using Aperture Phase Detection", IEEE Journal of Solid-State Circuits, vol. 33, No. 12, Dec. 1998, pp. 2232-2239.

(Continued)

*Primary Examiner* — Rahel Guarino
(74) *Attorney, Agent, or Firm* — Fish & Richardson P.C.

(57) ABSTRACT

A sub-sampling phase lock loop includes samplers that obtain sampled values by sampling clock signal phases corresponding to a clock signal generated by a voltage controlled oscillator at sampling edges of reference signal phases of a reference signal generated by a reference clock generator over a reference clock cycle; and a phase detector that selects a phase for a particular instant of the reference signal based on at least one sampled value satisfying a predetermined criteria, the phase corresponding to a clock signal phase value and a reference signal phase value respectively selected from the clock signal and reference signal phases, the phase detector tracks the selected phase at every successive instant of the reference signal, and determines a sampled value associated with the selected phase in every successive instant of the reference signal; and a processing unit that acquires frequency information based on the tracking of the selected phase.

20 Claims, 8 Drawing Sheets

(56) References Cited

U.S. PATENT DOCUMENTS

| | | | |
|---|---|---|---|
| 7,386,286 | B2 | 6/2008 | Petrovic et al. |
| 9,608,644 | B1 | 3/2017 | Raj et al. |
| 10,425,092 | B2 | 9/2019 | Shu et al. |
| 10,651,858 | B2 | 5/2020 | Ott et al. |
| 2019/0158101 | A1 | 5/2019 | Jakobsson |
| 2021/0119634 | A1* | 4/2021 | Yang .................. H03L 7/087 |

OTHER PUBLICATIONS

Xiang Gao et al., "A Low Noise Sub-Sampling PLL in Which Divider Noise is Eliminated and PDCP Noise is Not Multiplied by N2", IEEE Journal of Solid-State Circuits, vol. 44, No. 12, Dec. 2009, pp. 3253-3263.

Bart J. Thijssen et al., "Feedforward Phase Noise Cancellation Exploiting a Sub-Sampling Phase Detector", IEEE Transactions on Circuits and Systems—II: Express Briefs, vol. 65, No. 11, Nov. 2018, pp. 1574-1578.

Juyeop Kim et al., "An Ultra-Low-Jitter, mmW-Band Frequency Synthesizer Based on Digital Subsampling PLL Using Optimally Spaced Voltage Comparators", Journals & Magazines, IEEE Journal of Solid-State Circuits, vol. 54, Issue 12, Dec. 2019.

Zunsong Yang et al., "A 25.4-to-29.5GHz 10.2mW Isolated Sub-Sampling PLL Achieving -252.9dB Jitter-Power FoM and -63dBc Reference Spur", ISSCC 2019, Session 16, Frequency Synthesizers, 16.8.

* cited by examiner

The phase that spans/aligns the linear region (shaded phase around the origin) is tracked from the samples Phasor Snapshot @ (k+1)T$_{REF}$ Phasor Snapshot @kT$_{REF}$

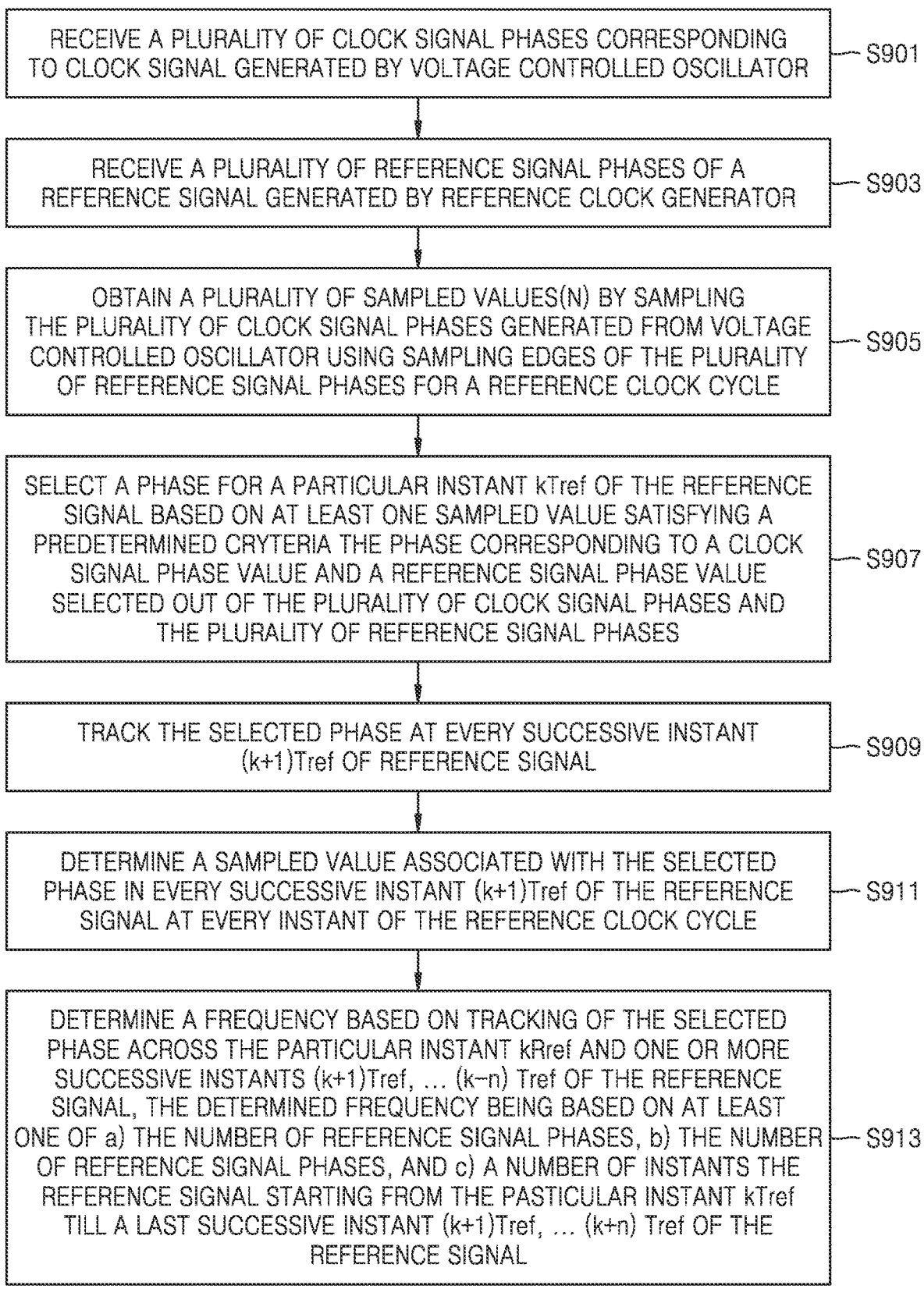

METHOD AND SYSTEM FOR LOW NOISE SUB-SAMPLING PHASE LOCK LOOP (PLL) ARCHITECTURE WITH AUTOMATIC DYNAMIC FREQUENCY ACQUISITION

CROSS-REFERENCE TO RELATED APPLICATIONS

A claim of priority under 35 U.S.C. § 119 is made to Indian Patent Application No. 202241037419, filed Jun. 29, 2022 in the Indian Intellectual Patent Office, the entirety of which is hereby incorporated by reference.

BACKGROUND

The present disclosure relates to sub-sampling phase lock loop (SSPLL) architecture and in-particular, to low noise sub-sampling phase lock loop (PLL) architecture with automatic dynamic frequency acquisition.

Sub-sampling PLLs have very low in-band phase noise and low reference spur. This is primarily because a sampler is used as a phase detector in place of a phase frequency detector as used in conventional charge pump PLLs. However, a sub-sampling phase detector (SSPD) is unable to track frequency changes because it is not a frequency discriminator. The in-band phase noise in a conventional charge pump PLL at the input of phase frequency detector gets transferred to the PLL output with the multiplication factor of the feedback divider. This noise can be diminished to low values with a sub-sampling PLL (SSPLL) that does not include a feedback divider, but which however utilizes a separate frequency acquisition loop in addition to the main PLL. A sub-sampling phase detector emulates mixer type phase detection. The sub-sampling phase detector however can not provide frequency discrimination. This results in very low frequency capture range and an optimal PLL bandwidth that can not be set independently to optimize jitter.

Further, conventional phase-frequency detector (PFD) charge pump loops with a feedback divider are widely used but compromise on the output noise of the PLL where the divider power forms a good chunk of the total power at high frequency design. In a charge pump (CP) PLL, the charge pump noise at the PLL output is multiplied by $N^2$ (the feedback divider ratio).

Thus, there is a need to provide a sub-sampling phase detector that can detect frequency error unlike conventional sub-sampling phase detectors, and that can provide infinite frequency capture range as compared to a very limited range as in conventional sub-sampling phase detectors.

SUMMARY

Embodiments of the inventive concepts provide a sub-sampling phase lock loop including a plurality of samplers that receive a plurality of clock signal phases corresponding to a clock signal generated by a voltage controlled oscillator, receive a plurality of reference signal phases of a reference signal generated by a reference clock generator, and obtain a plurality of sampled values by sampling the plurality of clock signal phases generated by the voltage controlled oscillator at sampling edges of the plurality of reference signal phases over a reference clock cycle of the reference signal; a phase detector that selects a phase for a particular instant kTref of the reference signal based on at least one sampled value satisfying a predetermined criteria, the phase corresponding to a clock signal phase value and a reference signal phase value respectively selected out of the plurality of clock signal phases and the plurality of reference signal phases, tracks the selected phase at every successive instant (k+1)Tref of the reference signal, and determines a sampled value associated with the selected phase in the every successive instant (k+1)Tref of the reference signal at every instant of the reference clock cycle; and a processing unit that acquires frequency information at the every successive instant (k+1)Tref based on the tracking of the selected phase. The acquired frequency information includes a frequency offset value determined based on a differential between the sampled values within a successor instant (k+1)Tref of the reference signal and the sampled values in the particular instant kTref of the reference signal, and a direction traversed by the selected phase between the particular instant kTref and successor instant (k+1)Tref.

Embodiments of the inventive concepts further provide a sub-sampling phase lock loop including a plurality of samplers that receive a plurality of clock signal phases corresponding to a clock signal generated by a voltage controlled oscillator, receive a plurality of reference signal phases of a reference signal generated by a reference clock generator, and obtain a plurality of sampled values by sampling the plurality of clock signal phases generated by the voltage controlled oscillator by sampling edges of the plurality of reference signal phases over a reference clock cycle of the reference signal; a phase detector that selects a phase for a particular instant kTref of the reference signal based on at least one sampled value satisfying a predetermined criteria, the phase corresponding to a clock signal phase value and a reference signal phase value respectively selected out of the plurality of clock signal phases and the plurality of reference signal phases, tracks the selected phase at every successive instant (k+1)Tref of the reference signal, and determines a sampled value associated with the selected phase in the successive instant (k+1)Tref of the reference signal at every instant of the reference clock cycle; and a processing unit that determines frequency information at the every successive instant (k+1)Tref based on the tracking of the selected phase across the particular instant kTref and one or more successive instants (k+1)Tref, ... (k+n)Tref of the reference signal. The determined frequency is based on at least one of a number of phases of the clock signal phases output by the voltage controlled oscillator, a number of the reference signal phases output by the reference clock generator, and a number of instants of the reference signal starting from the particular instant kTref till a last successive instant (k+1)Tref, ... (k+n)Tref of the reference signal.

Embodiments of the inventive concepts still further provide a method of sub-sampling phase detection in a sub-sampling phase lock loop including obtaining, by a plurality of samplers, a plurality of sampled values by sampling a plurality of clock signal phases generated by a voltage controller oscillator using sampling edges of a plurality of reference signal phases generated by a reference clock generator for a reference clock cycle; selecting a phase for a particular instant kTref of the reference signal based on at least one sampled value satisfying a predetermined criteria, said phase corresponding to a clock signal phase value and a reference signal phase value respectively selected out of the plurality of clock signal phases and the plurality of reference signal phases; tracking the selected phase at every successive instant (k+1)Tref of the reference signal; determining a sampled value associated with the selected phase in the every successive instant (k+1)Tref of the reference signal at every instant of the reference clock cycle; acquiring, using a processing unit, frequency information at the every successive instant (k+1)Tref based on the tracking of the selected phase. The acquired frequency information includes a frequency offset value determined based on a differential between the sampled values within a successor instant (k+1)Tref of the reference signal and the sampled values in the particular instant (kTref) of the reference signal, and a direction traversed by the selected phase between the particular instant kTref and the successor instant (k+1)Tref.

BRIEF DESCRIPTION OF THE DRAWINGS

The foregoing and other features of the inventive concepts will be described in detail with reference to the accompanying drawings in which like characters refer to like parts throughout the different views, and wherein:

FIG. 8 illustrate a flow chart descriptive of operation of the sub-sampling phase detector of the sub-sampling phase lock loop according to other embodiments of the inventive concepts.

DETAILED DESCRIPTION

As is traditional in the field of the inventive concepts, embodiments may hereinafter be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Embodiments of the inventive concepts provide a sub-sampling phase lock loop (PLL) including a modified sub-sampling phase detector that is capable of efficiently detecting frequency error. The modified sub-sampling phase detector has an average output term that is non-zero and indicative of frequency error to provide an infinite frequency capture range. The modified sub-sampling phase detector decouples the frequency capture range and bandwidth requirement leading to better jitter performance in the sub-sampling phase lock loop architecture. This is possible as a result of the modified sub-sampling phase detector generating a non zero average output when there is a frequency error The phase error settling time of the PLL is independent of the initial phase error. This is obtained by the monotonous (like-linear) phase transfer characteristic of the modified sub-sampling phase detector with almost constant gain.

Figure 1:
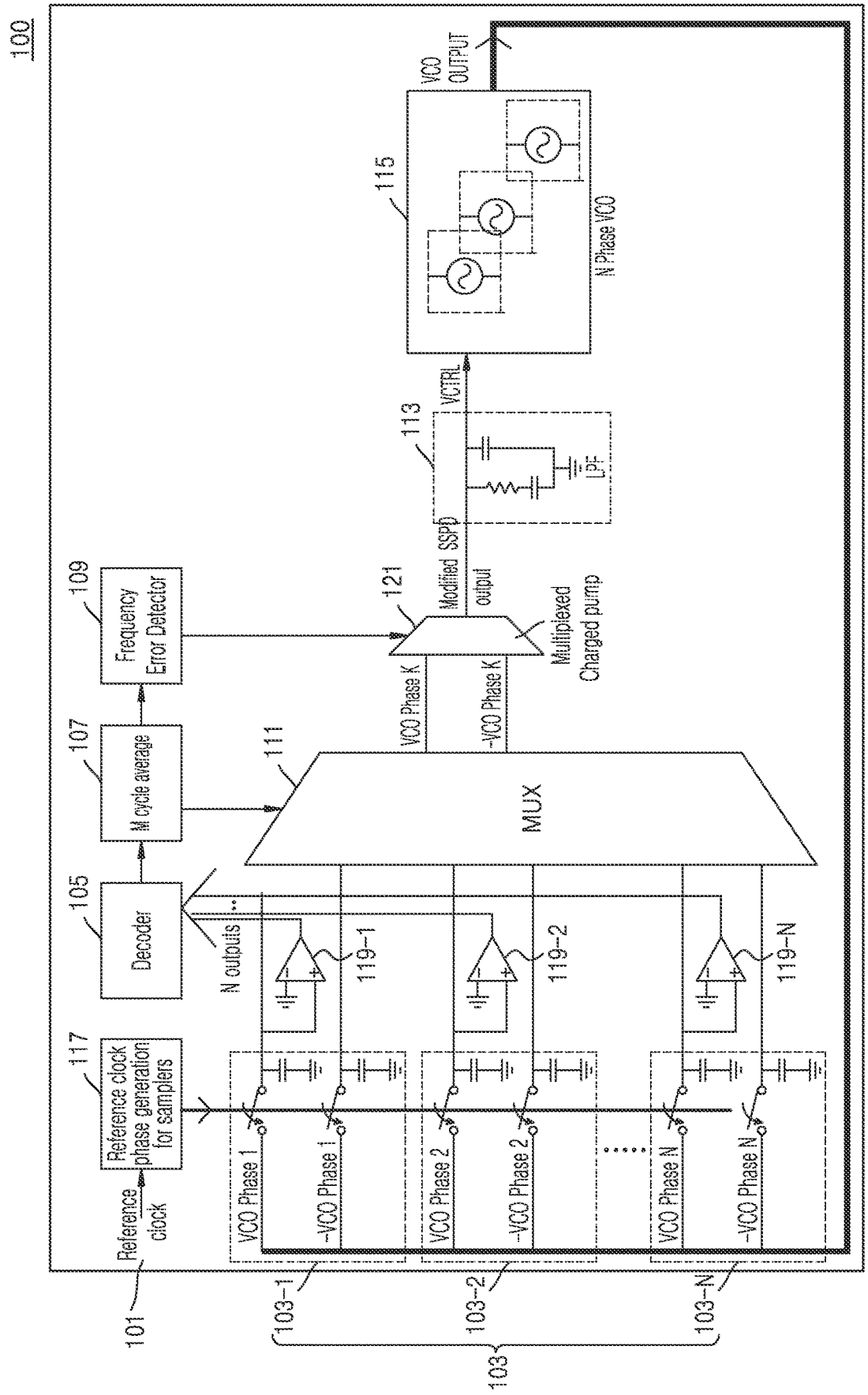
FIG. 1 illustrates detailed architecture of a sub-sampling phase lock loop according to embodiments of the inventive concepts.

FIG. 1 illustrates detailed architecture of a sub-sampling phase lock loop 100 according to embodiments of the inventive concepts. As shown in FIG. 1, sub-sampling phase lock loop (SSPLL) 100 includes one or more samplers 103-1, 103-2, . . . 103-N (which may hereinafter be characterized collectively as samplers 103) that receive one or more of clock signal phases corresponding to clock signal generated from voltage controlled oscillator (VCO) 115. N may be an integer greater than or equal to 2. The one or more clock signal phases are shown in FIG. 1 as VCO phase 1, VCO phase 2, . . . and VCO phase N. For example, clock signal phase VCO phase 1 is shown in FIG. 1 as VCO phase 1 and –VCO phase 1, clock signal phase VCO phase 2 as VCO phase 2 and –VCO phase 2, . . . and clock signal phase VCO phase N as VCO phase N and –VCO phase N. The samplers 103 may further receive one or more of reference signal phases (not shown) of a reference signal generated by reference clock generator 117. The one or more samplers 103 obtain and output the corresponding sampled values by sampling the respective clock signal phases output by VCO 115 at sampling edges of the corresponding reference signal phases for a reference clock cycle 101.

According to an embodiment, a decoder 105, an M cycle average block 107, and a frequency error detector 109 combined with a multiplexer (MUX) 111 and a multiplexed charged pump 121 perform a task of extracting an average frequency error sign and charging or discharging the control voltage (VCTRL) to correct a frequency error. Further, the block 111 is an analog multiplexer. The analog multiplexer chooses the correct phase based on the input from the M cycle average block 107. A positive or a negative sign is provided to the multiplexed charge pump 121 depending on the average frequency error. This sign value is the average frequency error sign extracted from the samplers 103.

According to a further embodiment, the multiplexed charge pump 121 output is equivalent to an output of a SSPD sampler in a traditional SSPLL. Thus, when the VCO frequency is not an integer multiple of reference clock frequency, the average output of a traditional SSPD sampler is zero. This prevents any possible frequency correction in a traditional SSPLL. On the other hand, according to the disclosed solution, the average frequency difference information is extracted using the samplers 103 and the decoder 105, the M cycle average block 107, and the frequency error detector 109.

In an implementation, the decoder 105, the M cycle average block 107, and the frequency error detector 109 combinedly on N inputs received from the N samplers 103.

Each of these N samplers 103 receives a reference clock input that fixes a time of sampling and an input VCO phase that gets sampled. The output of these N samplers 103 is N samples outputted at every reference clock period. These N samples are fed as inputs to N comparators (119). These comparators 119 determine the sign of the sampled differential VCO voltage. Accordingly, if the input to the comparator 119 is positive, the comparator 119 outputs a logic HIGH signal. If the input to the comparator 119 is negative, the comparator 119 outputs a logic LOW signal. From these N comparators 119, there are N outputs, each being either logic HIGH/LOW, given as input to the decoder 105.

According to a further embodiment, Multiplexer 111 is an analog multiplexer connected with the multiplexed charge pump 121. In an implementation, the analog multiplexer 111 is utilized to get a linear phase transfer characteristic. The multiplexed charge pump 121 is used to implement charge pump function. Further, the output of the frequency error detector 109 determines if polarity of the sampler 103 output voltage to the multiplexed charge pump 121 has to be inverted or not in every reference clock cycle.

Figure 2:
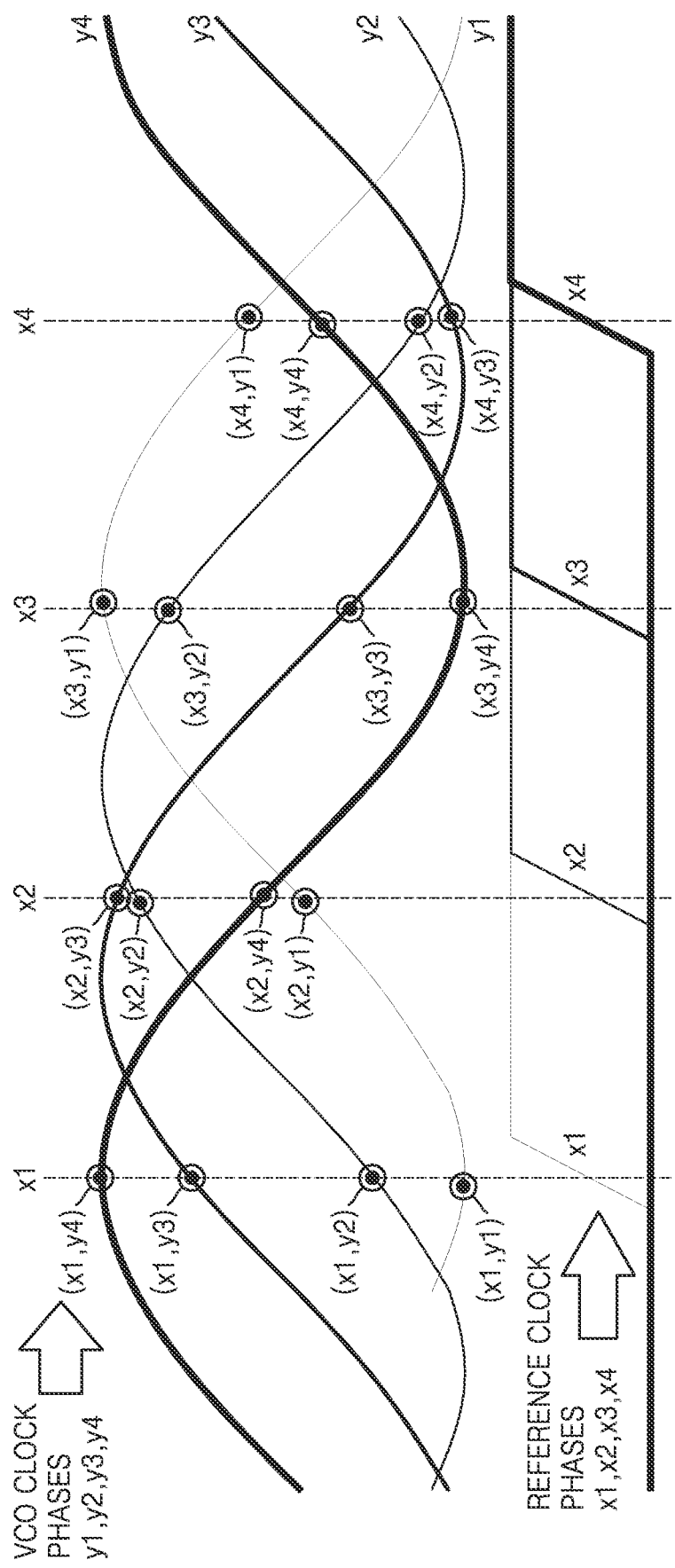
FIG. 2 illustrates a waveform representation of voltage controlled oscillator signals and reference signals, and sampling thereof, according to embodiments of the inventive concepts.

FIG. 2 illustrates a waveform representation of the clock signal phases (which hereinafter may also be referred to as clock signals) output from VCO 115 and the reference signal phases (which hereinafter may also be referred to as reference signals) as output from reference clock generator 117 and sampling thereof, according to embodiments of the inventive concepts. The one or more samples (i.e., sampled values) output from the samplers 103 may be characterized for example as (x1, y1), (x1, y2), (x1, y3), (x1, y4), (x2, y1), (x2, y2), (x2, y3), (x2, y4) (x3, y1), (x3, y2), (x3, y3), (x3, y4), (x4, y1), (x4, y2), (x4, y3) and (x4, y4) as shown in the Table 1 below. For example, y corresponds to a given phase of the VCO clock output from VCO 115 (sampled by different phases of the reference clock) of x output from reference clock generator 117. Table 1 shows one or more sampled values obtained by sampling performed by samplers 103.

TABLE 1

| x1, y1 | x2, y1 | x3, y1 | x4, y1 |
|---|---|---|---|
| x1, y2 | x2, y2 | x3, y2 | x4, y2 |
| x1, y3 | x2, y3 | x3, y3 | x4, y3 |
| x1, y4 | x2, y4 | x3, y4 | x4, y4 |

As an example, the plurality of the sampled values is a set of sampled values N. The set of sampled values N is obtained at a specific time instant corresponding to at least one of a rising sampling edge of the reference signal phases. The set of sampled values N is evaluated at corresponding N instants of the reference clock cycle. N may be defined as any integer number which is a substantially large enough number that would provide an N×N matrix from which N values (N×1) of a column matrix may be selected to enable the solution for selection of phases.

Referring back to the FIG. 1, the sampled values VCO phase 1, VCO phase 2, . . . and VCO phase N are output from samplers 103 through respective amplifiers 119-1, 119-2, . . . and 119N to decoder 105, and are also provided to multiplexer (mux) 111. The sampled values–VCO phase 1, –VCO phase 2, . . . and –VCO phase N are also output from samplers 103 to multiplexer 111.

Decoder 105 receives and decodes the outputs from amplifiers 119-1, 119-2 . . . and 119-N and provides a decoded output to M cycle average block 107. For example, decoder 105 determines the reference clock phase closest to the VCO zero crossing. When there are multiple phases of VCO, the zero crossing of the in-phase(I) or the 0° component is used. The decoder 105 keeps sending out this data at every reference clock cycle to the M cycle average block 107. The M cycle average block 107 finds out the average value of reference clock phase number sent by the decoder 105. The value of M cannot be set very high as this may result in output of the M cycle average block 107 being the average value of all the phase values. This results in no useful frequency error information. Thus, the value of M is chosen just large enough to filter out impact of high frequency phase noise. This determined value of phase number, which is the output of the M cycle average block 107, corresponds to the most linear phase transfer characteristic which can be selected if required using the analog multiplexer 111.

Thereafter, the frequency error detector 109 transmits the frequency error sign output to the multiplexed charge pump 121. Accordingly, there are only two possible outcomes that can be outputted at the multiplexed charge pump 121 based on the input from the frequency error detector 109. As the sampler 103 output comes through the analog multiplexer 111 to the multiplexed charge pump 121, the frequency error detector 109 decides if the polarity of the sampler 103 output needs to be inverted or not in the multiplexed charge pump 121 thereby generating the two possible outcomes. The function of the multiplexed charge pump 121 is to either charge or discharge the control voltage (VCTRL) of the SSPLL.

When the VCO frequency is different from the desired frequency, the sampler 103 output could be either positive or negative. Without using the solution to generate frequency error detector 109 output, which is the case of a traditional SSPLL, the charge pump output keeps charging and discharging the control voltage (VCTRL) as the phase error moves across from −180° to 180° phase error. This results in no net charging or discharging of the control voltage (VCTRL) hence not correcting the frequency error. This can be fixed only if the charging or discharging of the control voltage corresponded to the frequency error direction.

In other words, if the VCO frequency is greater than the desired frequency, the control voltage (VCTRL) has to be discharged until the VCO frequency matches with the desired frequency. This translates to the sampler 103 output coming out to be a negative voltage when it comes through the multiplexed charge pump 121. Regardless of whether the differential voltage input available at the input of the multiplexed charge pump 121 is positive or negative, the output of the multiplexed charge pump 121 has to be negative in this case. This requires knowing two type of information, the actual sign of the differential sampler output and the sign of the frequency error.

According to an embodiment, the actual sign of the differential sampler output is provided by the decoder 105 through the M cycle average block 107 to frequency error detector block 109. The frequency error sign is determined by block 109, the frequency error detector, using a difference operation on the input from the M cycle average block 107. The M cycle average block 107 provides the value of determined averaged reference clock phase number on every reference clock cycle. By performing a difference operation, it is possible to determine if the sense of movement of these phases is clockwise or counter-clockwise. For this specific case, it will be counter-clockwise.

Alternately, if the VCO frequency is lower than the desired frequency, the control voltage (VCTRL) has to be charged until the VCO frequency matches with the desired frequency. This translates to the sampler 103 output coming out to be a positive voltage when it comes through the multiplexed charge pump 121. Regardless of whether the differential voltage input available at the input of the multiplexed charge pump 121 is positive or negative, the output of the multiplexed charge pump 121 has to be positive in this case. This requires knowing two type of information, the actual sign of the differential sampler output and the sign of the frequency error. As explained above, the actual sign of the differential sampler output is provided by the decoder 105 through the M cycle average block 107 to the frequency error detector block 109. The frequency error sign is determined by the frequency error detector 109 using a difference operation on the input from the M cycle average block 107. The M cycle average block 107 provides the value of chosen averaged reference clock phase number on every reference clock cycle to the frequency error detector block 109. By performing a difference operation, it is possible to determine if the sense of movement of these phases is clockwise or counter-clockwise. For this specific case, it will be clockwise. These two cases are illustrated in the table 1a below.

TABLE 1a

| Sampler output | Frequency error direction | VCO Frequency | Required operation in multiplexed charge pump | Frequency error detector output |
|---|---|---|---|---|
| Positive | Clockwise | <desired frequency | Charge | Don't invert |
| Positive | Counter-Clockwise | >desired frequency | Discharge | Invert |
| Negative | Clockwise | <desired frequency | Charge | Invert |
| Negative | Counter-Clockwise | >desired frequency | Discharge | Don't invert |

Figure 3:
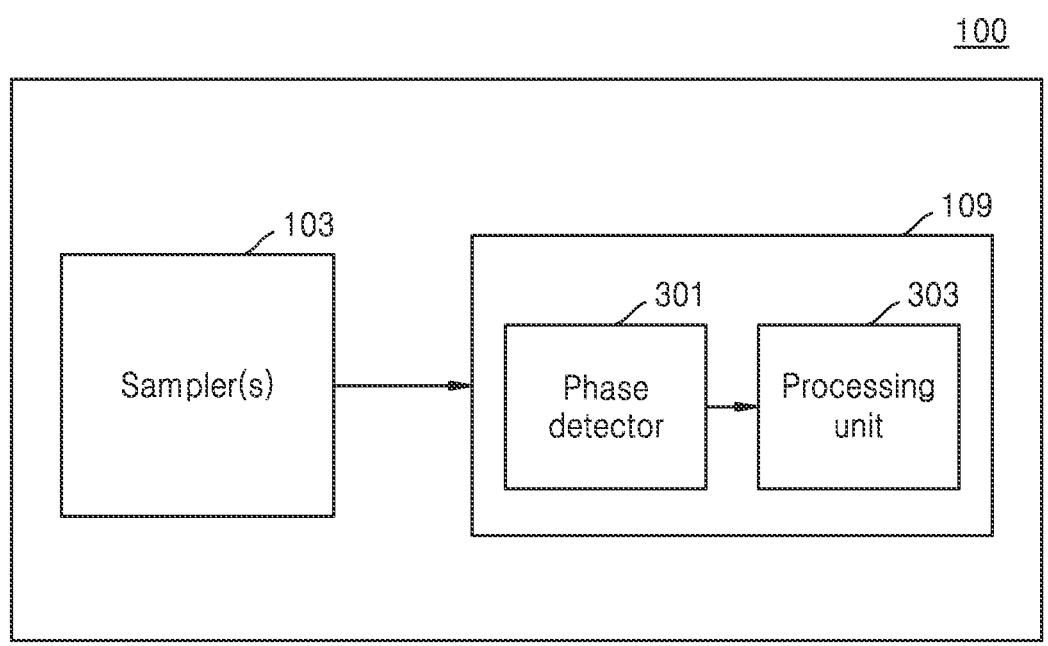
FIG. 3 illustrates detailed architecture of the sub-sampling phased detector according to embodiments of the inventive concepts.

FIG. 3 illustrates detailed architecture of sub-sampling phase detector 109 according to embodiments of the inventive concepts. According to FIGS. 1 and 3, sub-sampling phase detector 109 is operatively coupled to decoder 105, M cycle average block 107 and the frequency phase detector k 121. Sub-sampling phase detector 109 includes phase detector 301 and processing unit 303, and is operatively coupled to the samplers 103 through decoder 105 and M cycle average block 107 (which are omitted from FIG. 3 for the sake of brevity). According to the FIG. 3, the phase detector 301 is configured to select a phase for a particular instant kTref of the reference signal provided from reference clock generator 117 based on at least one sampled value (x3, y3) satisfying a predetermined criterion. The phase corresponding to a clock signal phase (y3) provided from VCO 115 and a reference signal phase value (x3) from reference clock generator 117 is selected out of the plurality of samples as shown in the Table 1. As an example, the predetermined criteria can be a zero crossing criteria in the case of a sinusoid wave, or a slope based criteria in the case of piecewise linear (PWL).

Figure 4:
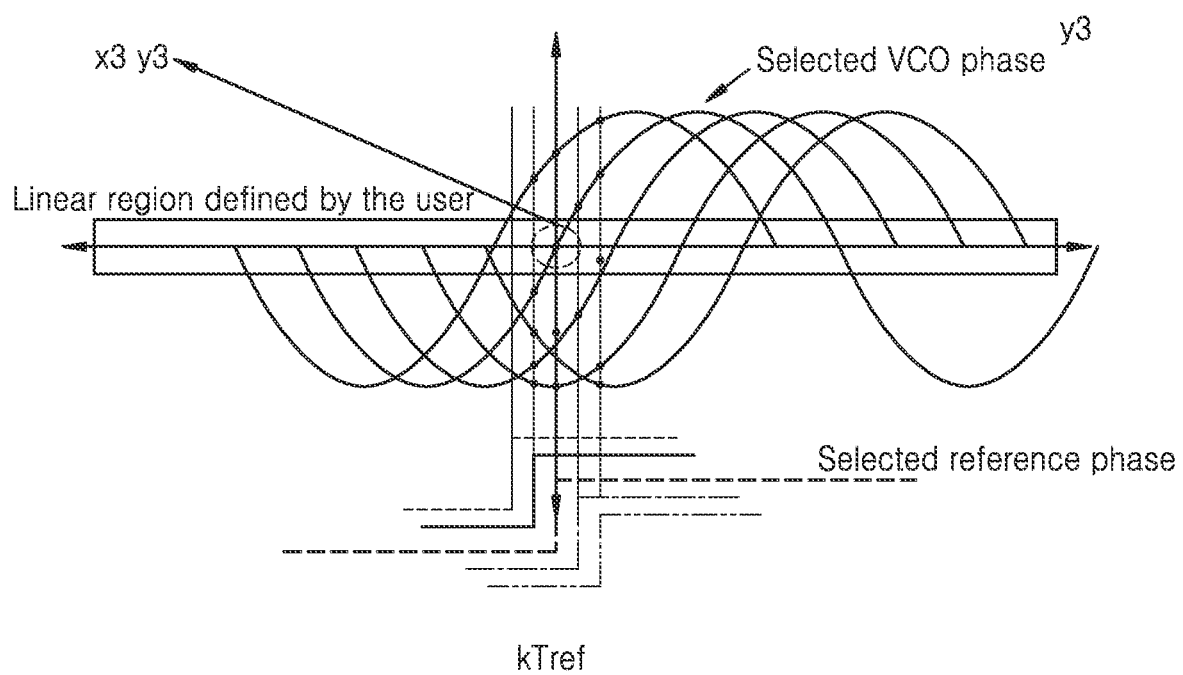
FIG. 4 illustrates selection of a phase for a particular instant kTref of the reference signal according to embodiments of the inventive concepts.

The selection of a phase for a particular instant kTref of the reference signal from reference clock generator 117 is shown in the FIG. 4. Thereafter, the phase detector 301 is configured to select a phase for every successive instant (k+1)Tref of the reference signal. For example, the phase detector 301 determines a sampled value (x4, y4) associated with the successive instant (k+1)Tref of the reference signal at every instant of the reference clock cycle to determine phase or frequency information. Subsequently, the phase detector 301 is configured to determine a sampled value (x4, y4) associated with the detected phase in the successive instant (k+1)Tref of the reference signal.

According to embodiments of the inventive concepts, the phase detector 301 while selecting the phase within the particular instant is configured to evaluate the sampled values (x3, y3) and (x4, y4) as meeting the predefined criteria linked with a shape of the waveform underlying the clock signal from the VCO 115. As mentioned, the predefined criteria may be the zero crossing criteria in the case of sinusoid wave, or the slope-based criteria in case of PWL. Further, the sampled values (x3, y3) and (x4, y4) correspond to a linear phase response curve in accordance with linear phase frequency detector (PFD) based characteristics. The phase detector 301 selects in a pair of phases, the phase in particular instant kTref and (k+1)Tref of the reference clock cycle, the sampled values in accordance with a user-defined linear region. The user-defined linear region is based on a power/resolution based trade-off associated with the PLL. The number of phases of the clock signal and/or the reference signal is based on the power target of the PLL.

As an example, assuming (x3, y3) is the selected phase in kTref, the selected phase is tracked in (k+1)Tref based on the same criteria as would have been applied in kTref. However, now the sampled value for the tracked phase in the (k+1)Tref is only changed in one dimension and is (x3,y2). As a further example, the tracked phase sample value may also change in both dimensions and may for example be (x4, y14). Overall, either only phase value y changes, or both phase value y and reference value x may change in tracked phase.

Figure 5:
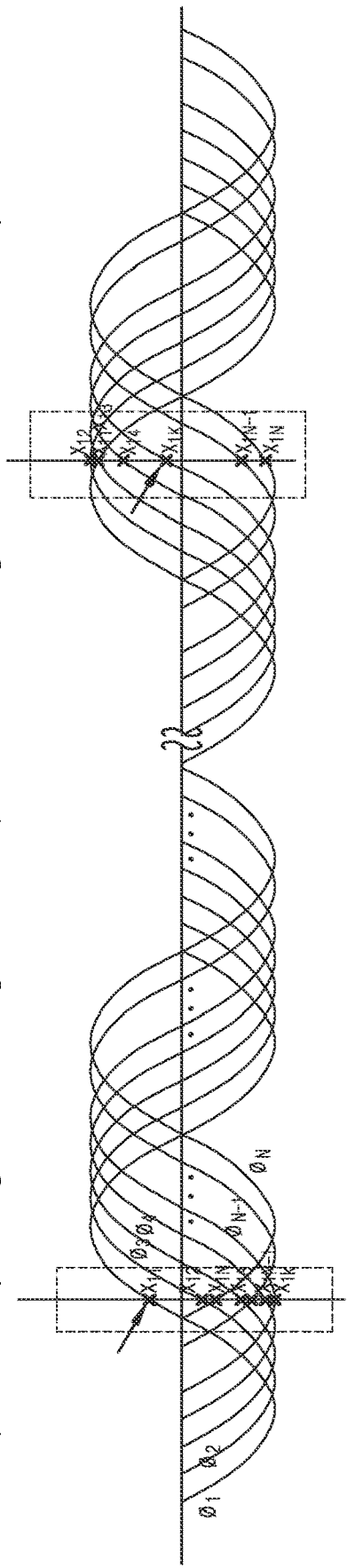
FIG. 5 illustrates a phasor diagram of the tracked samples according to embodiments of the inventive concepts.
Figure 5:
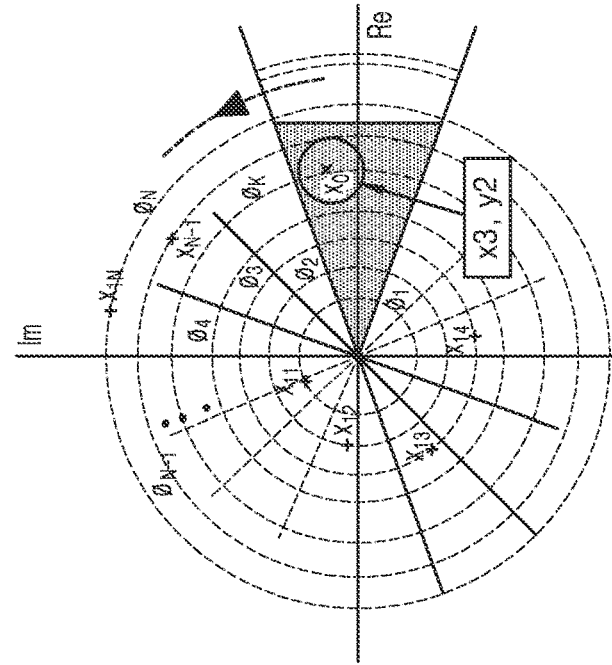
Figure 5:
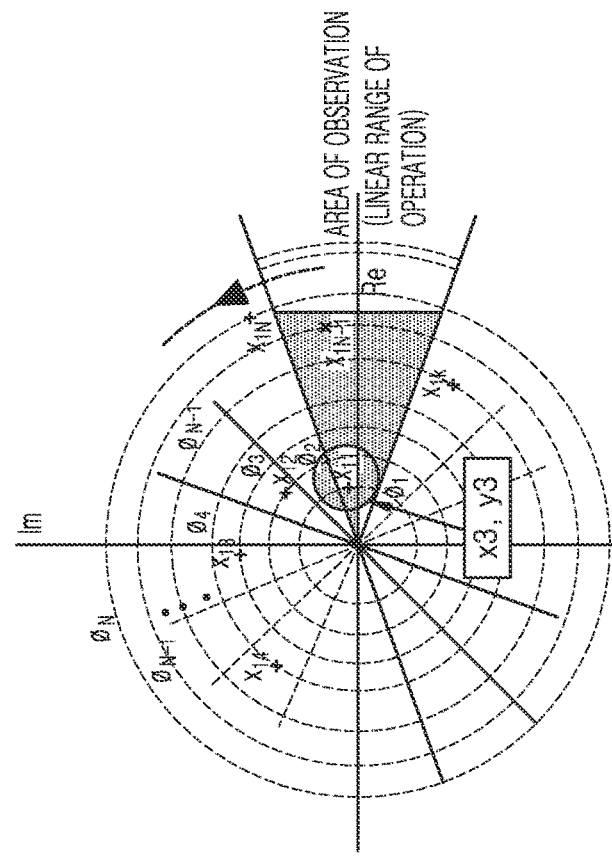
Figure 6:
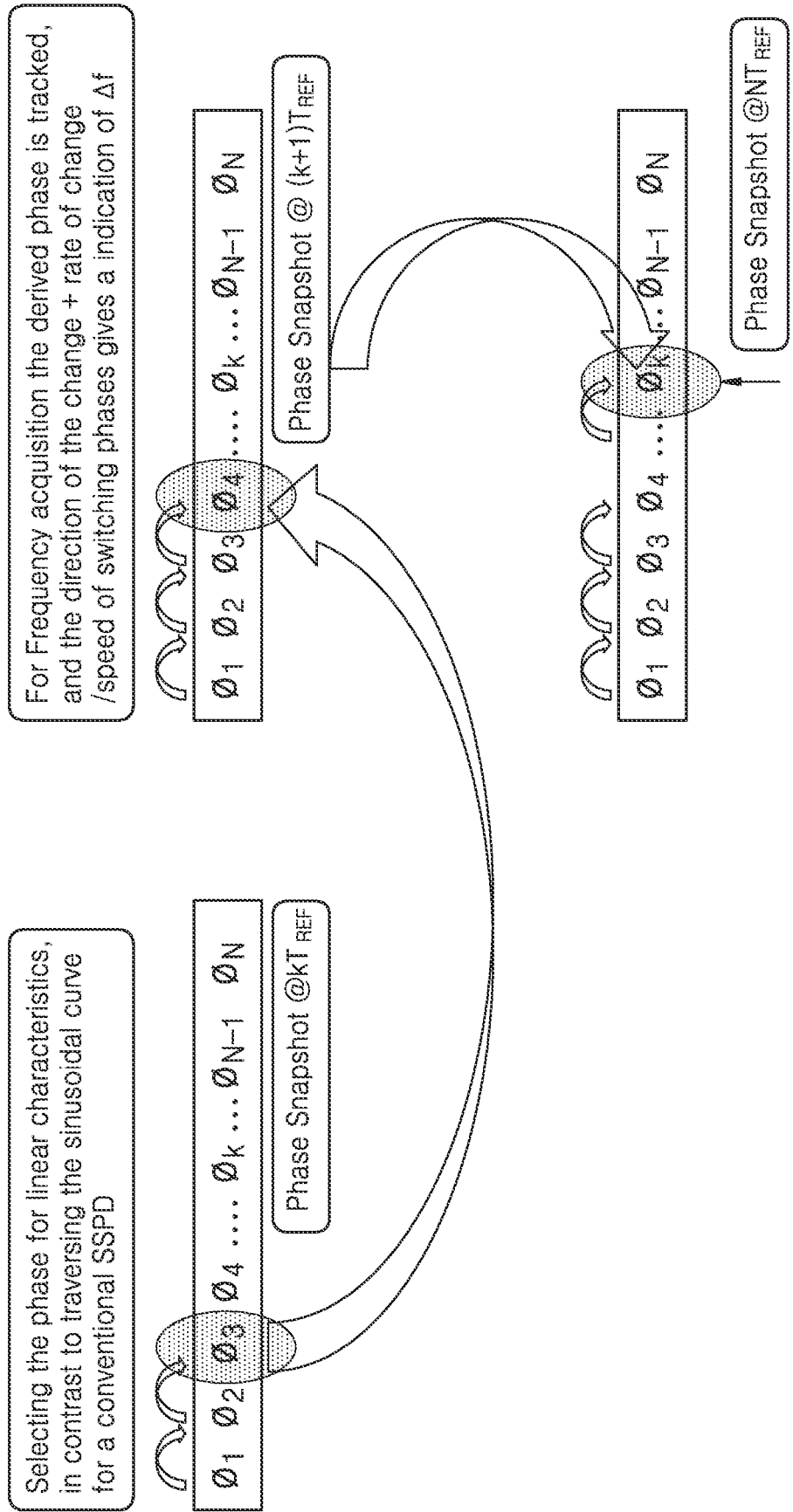
FIG. 6 illustrates a mathematical example of the phase tracking according to embodiments of the inventive concepts.

FIG. 5 illustrates a phasor diagram of the tracked samples according to embodiments of the inventive concepts. Further, FIG. 6 illustrates a mathematical example of the phase tracking according to embodiments of the inventive concepts.

According to an embodiment, FIG. 5 explains how a linear phase transfer characteristic can be obtained. In a traditional charge pump PLL, the phase frequency detector (PFD) ensures frequency error detection and linear phase tracking behavior. In a traditional SSPLL, the phase transfer characteristic is sinusoidal. More precisely, it follows a shape of the VCO waveform coming as input to the sampler 103. This non-linearity in phase transfer characteristic in a traditional SSPLL leads to some undesirable behavior. For example, when the VCO waveform leads in phase by either 45° or 135°, the output voltage of the sampler 103 is the same, but the phase settling time for the 135° phase error is higher compared to the 45° case. In a linear system, the applied correction is proportional to the error sensed by the system. Further, when the phase error is higher than 135°, it takes more time for phase error settling compared to 0° to 90° phase error range. This is a direct consequence of the sinusoidal transfer function which is non-linear. In terms of phase noise, non-linearity has undesirable effect of generating higher harmonics and increasing the integrated jitter.

According to present disclosure, the idea of making the phase transfer characteristic linear is to use a limited portion of the sinusoidal curve. For example, in a range chosen between −90° and 90° of the sinusoidal curve, the phase transfer curve can be maintained linear. These two limits on phase can be translated to limits in voltage. These voltage limits are sensed at the output of the sampler 103. Thus, it is possible to determine if the presently chosen VCO curve has gone out of the specified linearity phase limits. Further, it is to be noted that in cases where linear range is not desired, the reference in the comparator is set just to sense if the differential VCO voltage is positive or negative. Further, implementing the aforesaid is not possible by using a single phase of the VCO. So, in the solution, multiple phases of VCO are used. The sampler 103 output connects to the comparator 119. The comparator 119 reference can be set to sense if the sampler 103 output is greater than the linearity limit. When the comparator 103 output signals that the present VCO phase has gone out of linearity limits, a move to a different VCO phase has to be made. The VCO phase that is adjacent to the present phase and is within the linearity limits is chosen. Essentially, the idea is to always select a VCO phase that is within the linearity limits. If instead of ±90°, a smaller value, say ±450 is chosen, the phase transfer curve will be closer to a perfect linear curve. When the choice is made to change the VCO phase, it is done in the analog multiplexer 111. The corresponding VCO output phase's sampled voltage is sent to the multiplexed charge pump 121.

FIG. 5 shows multiple phases of VCO being sampled by the reference clock phases. For the VCO phase, yi or $\Phi i$ is interchangeably used. For the reference clock phase, xi is used. The values sampled by the reference clock phases in the top two diagrams is indicated in each of the corresponding polar plots below at (b). The (a) of FIG. 5 and (b) of FIG. 5 correspond to two successive sampling instants. They are marked K*Tref and (K+1)*Tref. the time window in which reference clock phases samples the VCO is demarcated with a rectangle in both the diagrams. In the polar plot (a) and (b) of FIG. 5, the sampled amplitude corresponding to each VCO phase (yi or $\Phi i$) is marked using concentric circles. Since the VCO phases are equally spaced in phase, at any instant it is true that these phases differ by the same phase. For example, in an eight-phase VCO, every successive phase is separated by 45°. This results clearly in the sampled amplitudes corresponding to the sine of $n*(\theta+45)$ ° where n goes from 0 to 7 and $\theta$ is the phase offset for that sampling reference cycle. The multiple reference clock phases are represented by radial lines all intersecting at the origin. These phases of reference clock are separated in phase by design depending on the resolution required and the rate at which frequency acquisition needs to happen.

Further, the two polar plots (a) and (b) of FIG. 5 shows phasor snapshots at two consecutive reference clock instants. It can be seen that in the time instant K*Tref, the chosen VCO phase which lies in the linear range is y3. In the next reference clock cycle, which is at time instant (K+1)*Tref, the VCO phase y3 is no more inside the linear range. So, it has to be changed from y3 to y2. Now, y2 is the VCO phase in the linear range. It is clear that the linear range falls in the first and fourth quadrants close to the real axis. The reference clock phase used in both these instants is x3. So (x3, y3) gets changed to (x3, y2).

The FIG. 6 details the same process further. In particular, FIG. 6 shows how the phasor movement happens during frequency acquisition. A generic case is assumed where linear phase transfer characteristic is desired. In this case, as shown in the FIG. 6, the VCO phase that falls in the linear range keeps changing because of the frequency error. This is indicated in the phasor snapshots shown at K*Tref and (K+1)*Tref. The chosen VCO phase changes from $\Phi 3$ at K*Tref to $\Phi 4$ at (K+1)*Tref. Further, the choice of deciding the VCO phase is done in the decoder 105 and M cycle averaging block 107. This is the same procedure that is used to determine the reference clock phase closest to the 0° VCO phase when a linear phase characteristic is not desired. As far as the decoder 105 and M cycle averaging block 107 are concerned, the two cases, based on whether linear phase transfer characteristic is desired or not is indistinguishable looking at the sampler 103 outputs. Hence the exact same procedure is used. The only difference being that this chosen VCO phase, in cases where linear phase transfer curve is desired, selected in the analog multiplexer 111 keeps changing until frequency lock and phase lock are achieved. When frequency lock and phase lock are both achieved at N*Tref, there is no further change in the VCO phase. It is fixed at $\Phi k$. This is shown in the FIG. 6. The frequency error detector performs the same function in cases where linear phase characteristic is desired and in cases where linear phase characteristic is not desired. It generates a frequency error sign output indicating to the multiplexed charge pump whether to charge or discharge the control voltage (VCTRL) and correspondingly increase or decrease the frequency of the VCO.

In cases where linear phase transfer characteristic is not desired, there is no change in sampling phase and the sampler always outputs the same VCO phase output voltage to the multiplexed charge pump. Though there are multiple reference clock phases sampling the multi-phase VCO, there is a fixed chosen phase of reference clock used to output the sample of a fixed phase of the VCO to the multiplexed charge pump. This choice of sampling phase can be made in the analog multiplexer 111. The other phases of the reference clock still continue to sample the multi-phase VCO. This is required to extract the frequency error information. The N outputs sampled through the N comparators is used to determine the reference clock phase that is closest to the 0° VCO phase. This data is collected every reference clock cycle. The decoder 105, the M cycle average 107 and the frequency error detector 109 operates to generate a frequency error sign output to the multiplexed charge pump as explained in the above paragraphs. This frequency error sign output indicates to the multiplexed charge pump whether it needs to charge or discharge the control voltage (VCTRL) and correspondingly increase or decrease the frequency of the VCO.

According to further embodiments of the inventive concepts, as explained above there is provided simultaneous tracking of the selected phase by the phase detector 301, and acquisition of frequency information by processing unit 303. In a further embodiment, the processing unit 303 is configured to acquire frequency information at every successive instant (k+1)Tref based on the tracking of the selected phase. Both tracking of the selected phase and acquiring of the frequency information occurs at the same time based on an algorithm that studies the divergence of the selected phase through the time stamps kTref, (k+1)Tref. Further, the phase tracking in all the subsequent intervals determines the rate of change of phase that in effect defines the frequency.

Furthermore, the information is collected over 'M' clock cycles for the reference clock corresponding to an "k+M" number, where "M" is a integer chosen large enough to filter out effect of high frequency noise. The acquired frequency information includes i) a frequency offset value calculated based on a differential between the sampled values (x4, y4) within the successor instant (k+1)Tref of the reference signal and the sampled values (x3, y3) in the particular instant kTref of the reference signal, and ii) a direction traversed by the selected phase between the particular kTref and a successive instant (k+1)Tref. The acquired frequency information provides information of frequency offset/error ($\Delta f$) as follows:

a) The sign of the frequency error/offset "$\Delta f$" can be derived by noting the clockwise/anticlockwise movement of the chosen phase (nearest to the zero crossing), and b) The magnitude of Δf can be roughly computed by calculating the differential of the phase offset in the digital domain.

In a further embodiment of the inventive concepts, the acquired frequency information is derived by averaging the acquired frequency information, to obtain average frequency information over the reference clock cycles corresponding to an k+M number. As an example, the "Δf" calculated herein is the instantaneous value that is calculated for a time interval over the reference clock cycles corresponding to M number. Thus, an average value of the "Δf" may be calculated. Alternatively, the average value of the "Δf" may be referred as a mean value without deviating from the inventive concepts.

According to further embodiments of the inventive concepts, the processing unit 303 as shown in FIG. 3 may be further configured to determine a magnitude and direction of a phase offset (Δp) between the particular instant and the successive instant based on a correlation of the sampled values (x3, y3) and (x4, y4), to thereby obtain a differential between the sampled values (x3, y3) and (x4, y4). Thereafter, the processing unit 303 may determine a time interval (Δt) (i.e., absolute value of x3-x4) between the particular instant and the successive instant of the reference signal and thereby obtain the frequency offset (Δf) based on a ratio of Δp and Δt. As an example, the time interval (Δt) is actually the period of the reference clock cycle inherent to the implementation. Further, in order to obtain the direction traversed by the selected phase between the particular kTref and successive instant (k+1)Tref, the processing unit 303 may be configured to identify a movement of the selected phase between the particular instant and the successive instants of the reference signals as being at least one of a clockwise or an anticlockwise movement of selected phase. The processing unit 303 may be configured to thereafter indicate the identified direction of the movement of the selected phase as a direction of the frequency offset (Δf).

According to further embodiments of the inventive concepts, the processing unit 303 for obtaining the direction traversed by the selected phase between the particular kTref and successive instant (k+1)Tref may be configured to identify a movement of the selected phase between the particular instant and the successive instants of the reference signals based on a sign associated with the magnitude of the phase offset (Δp) and indicate the identified sign as a direction of the frequency offset. The processing unit 303 may be configured to control the VCO 115 based on the determined the frequency offset.

As an example, the "Δp" calculated is the instantaneous value calculated for a time interval over the reference clock cycles corresponding to M number. Thus, an average value of the "Δp" may calculated. Alternatively, the average value of the "Δp" may be referred as a mean value without deviating from embodiments of the inventive concepts.

As an example, the frequency offset between two instants may be computed as for example:
a) y4-y3, if x3 or the reference clock phase remains constant,
b) x3-x4, if y3 or the VCO 115 phase remains constant,
c) a combination of y4-y3 and x3-x4 if sampled values change in both x and y dimensions,
d) in yet another example, all values (y5, y7, . . . , y10, y11) corresponding to VCO 115 phase in one time instant with respect to a common selected reference phase (x3) may be differentiated from corresponding VCO 115 values in other instant and averaged to obtain phase offset or frequency offset, or e) likewise, such calculations would also automatically provide a "sign" which will denote direction, i.e. upsurge or down surge.

According to still further embodiments of the inventive concepts, the processing unit 303 may be configured to compute a frequency based on the tracking of the selected phase across the particular instant kTref and one or more successive instants (k+1)Tref, . . . (k+n) Tref of the reference signal. Both tracking of the selected phase and acquiring of the frequency information occurs at the same time based on an algorithm that studies the divergence of the selected phase through the time stamps kTref, (k+1)Tref. Further, the phase tracking in all the subsequent intervals determines the rate of change of phase that in effect defines the frequency error.

In an embodiment of the inventive concepts, the computed frequency being based on at least one of the number of phases of clock signal phases, the number of the phases of the reference signal, and a number of instants of the reference signal starting from the particular instant kTref until a last successive instant (k+1)Tref, . . . (k+n) Tref of the reference signal. Thus, according to this embodiment, the mechanism performed by the samplers 103 and the phase detector 301 remains the same as explained above.

Figure 7:
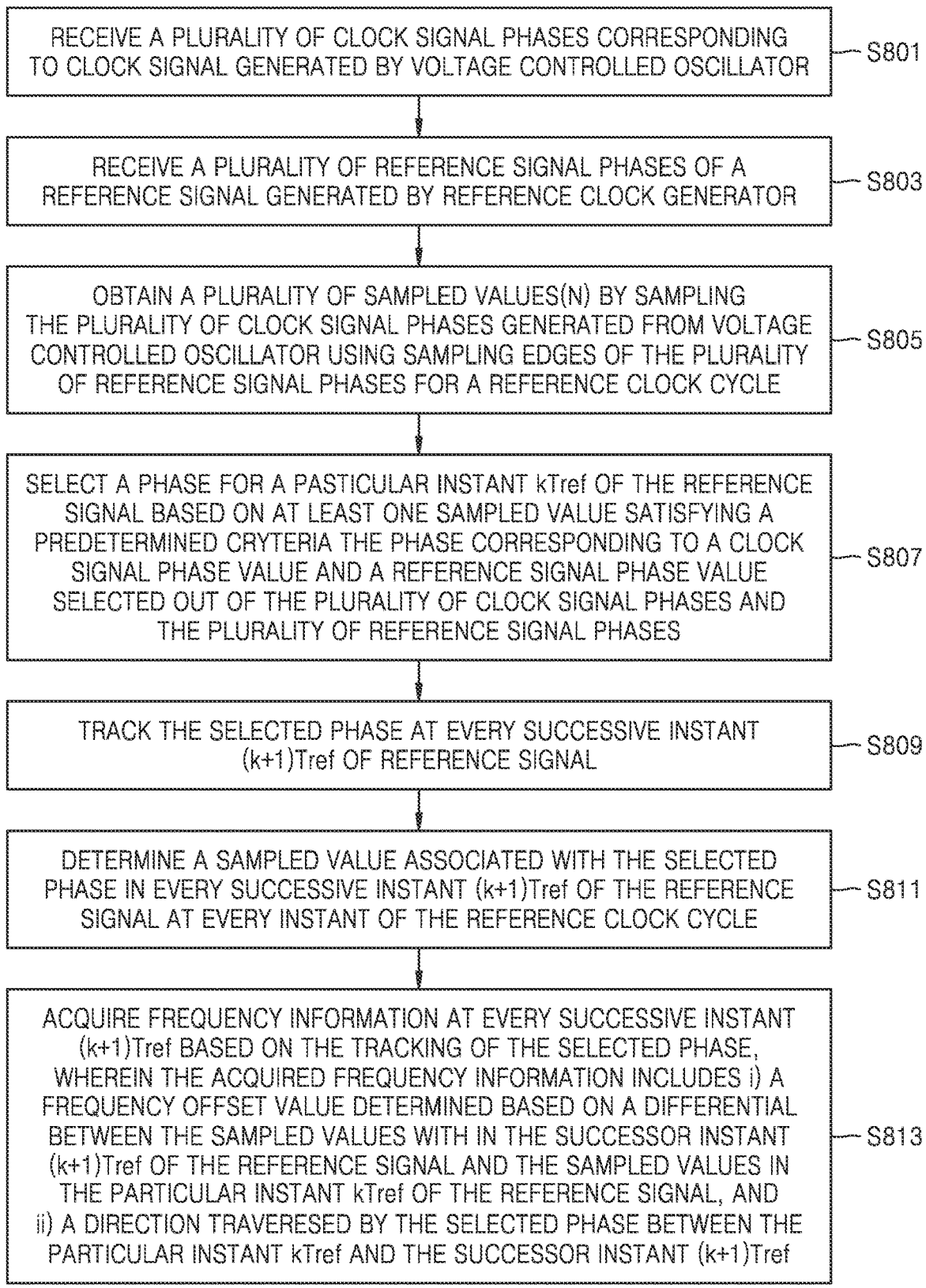
FIG. 7 illustrate a flow chart descriptive of operation of the sub-sampling phase detector of the sub-sampling phase lock loop according to embodiments of the inventive concepts.

FIG. 7 illustrate a flow chart descriptive of operation of the sub-sampling phase detector 109 of the sub-sampling phase lock loop 100 according to embodiments of the inventive concepts. The process flow 800 of FIG. 8 is described with reference to FIGS. 1-3.

At step S801, the samplers 103 receive a plurality of clock signal phases corresponding to the clock signal from VCO 115. Then at S803, the samplers 103 receive a plurality of reference signal phases of a reference signal from reference clock generator 117. Thereafter, at step S805, the samplers 103 obtain a plurality of sampled values by sampling the plurality of clock signal phases generated by VCO 115 at sampling edges of the plurality of reference signal phases for a reference clock cycle as provided by reference clock generator 117.

Thereafter at step S807, phase detector 301 selects a phase for a particular instant kTref of the reference signal based on at least one sampled value (x3, y3) satisfying a predetermined criterion. For example, the selected phase may correspond to a phase value (y3) and a reference signal phase value (x3) respectively selected out of the plurality of clock signal phases output by VCO 115 and the plurality of reference signal phases output by reference clock generator 117. In particular, the phase detector 301 while selecting the phase within the particular instant, in S809 tracks the selected phase in successive instants and evaluates the sampled values (x3, y3) and (x4, y4) as meeting the predefined criteria linked with a shape of the waveform underlying the clock signal from the VCO 115. Further, both tracking of the selected phase and acquiring of the frequency information occurs at the same time based on an algorithm that studies the divergence of the selected phase through the time stamps kTref and (k+1)Tref. Further, the phase tracking in all the subsequent intervals determines the rate of change of phase that in effect defines the frequency error.

At step S811, the phase detector 301 determines a sampled value (x4, y4) associated with the selected phase in the successive instant (k+1)Tref of the reference signal as an example, the sampled values (x3, y3) and (x4, y4) correspond to a linear phase response curve in accordance with linear phase frequency detector (PFD) based characteristics. In particular, the information is collected over M clock cycles of the reference clock where "M" is a integer chosen large enough to filter out high frequency noise. In a further implementation, the phase detector configured in accordance with a user-defined linear region for selecting the phase in particular instant kTref, the successive instants (k+1)Tref of the reference signal, and the sampled values, wherein the user-defined linear region is based on a power/resolution based trade-off associated with the PLL. The number of the phases of the clock signal and/or the reference signal is based on the power target of the PLL.

At step S813, the processing unit 303 acquires frequency information based on the tracking of the selected phase, wherein the acquired frequency information includes: i) a frequency offset value calculated based on a differential between the sampled values (x4, y4) within the successor instant (k+1)Tref of reference signal and the sampled values (x3, y3) in the particular instant kTref of the reference signal; and ii) a direction traversed by the selected phase between the particular kTref and successive instant (k+1) Tref. For example, in embodiments of the inventive concepts the processing unit 303 obtains the frequency offset value by determining a magnitude of a phase offset (Δp) between the particular instant and the successive instant based on a correlation of the sampled values (x3, y3) and (x4, y4), and thereby obtains a differential between the sampled values (x3, y3) and (x4, y4). Thereafter, the processing unit 303 determines a time interval (Δt) between the particular instant and the successive instant of the reference signal and obtains the frequency offset (Δf) based on a ratio of Δp and Δt. Thus, as the tracking of the phase and acquiring of frequency information is occurring at the same time, it is a result of observing a large number of sampling instants M reference clock cycles. In particular, both tracking of the selected phase and acquiring of the frequency information occurs at the same time based on the algorithm that studies the divergence of the selected phase through the time stamps kTref and (k+1)Tref. Further, the phase tracking in all the subsequent intervals determines the rate of change of phase that in effect defines the frequency error.

In further embodiments of the inventive concepts, the processing unit 303 may obtain the direction traversed by the selected phase between the particular kTref and successive instant (k+1)Tref by identifying a movement of the selected phase between the particular instant and the successive instant of the reference signals in at least one of a clockwise or an anti-clockwise movement of selected phase. The processing unit 303 may indicate the identified direction of the movement of the selected phase as a direction of the frequency offset (Δf).

In further embodiments of the inventive concepts, the processing unit 303 may obtain the direction traversed by the selected phase between the particular kTref and successive instant (k+1)Tref by identifying a movement of the selected phase between the particular instant and the successive instant of the reference signals based on a sign associated with the magnitude of the phase offset (Δp); and may indicate the identified sign as a direction of the frequency offset. In yet further embodiments of the inventive concepts, the phase detector 301 may be configured in accordance with a user-defined linear region to select the phase in a particular instant kTref of the reference signal, the successive instants (k+1)Tref of the reference signal, and the sampled values, wherein the user-defined linear region is based on a power/resolution based trade-off associated with the sub-sampling PLL 100. The number of phases of the clock signal and/or the reference signal may be based on the power target of the sub-sampling PLL 100. The VCO 115 may be further controlled by the processing unit 303 based on the determined frequency offset.

FIG. 8 illustrates a flow chart descriptive of operation of the sub-sampling phase detector 109 of the sub-sampling phase lock loop 100, according to another embodiment of the inventive concepts. The process flow 900 in FIG. 9 may be implemented based on the structures as shown in the FIGS. 1-3 whereby steps S901-S911 respectively correspond and are the same as steps S801-S811 of FIG. 7. Thus, for the sake of brevity, description of steps S901-S911 of FIG. 8 are hereinafter omitted.

At step S913 in FIG. 8 the method 900 includes the processing unit 303 determining a frequency based on the tracking of the selected phase across the particular instant kTref and one or more successive instants (k+1)Tref, . . . (k+n)Tref of the reference signal. Thus, both tracking of the selected phase and acquiring of the frequency information occurs at the same time based on an algorithm that studies the divergence of the selected phase through the time stamps kTref and (k+1)Tref. Further, the phase tracking in all the subsequent intervals determines the rate of change of phase that in effect defines the frequency. Further, the determined frequency is based on at least one of a) the number of phases of the clock signal phases; b) the number of reference signal phases; and c) a number of instants of the reference signal starting from the particular instant kTref till a last successive instant (k+1)Tref, . . . (k+n)Tref of the reference signal.

Embodiments of the inventive concepts thus provide technical advantages of providing an infinite lock range and capture range. The bandwidth of the sub-sampling PLL 100 may be set independent of the frequency acquisition requirement. This results in optimized jitter performance (i.e., a wider frequency acquisition range doesn't necessarily translate to a larger PLL bandwidth). Moreover, the sub-sampling PLL 100 may retain all the advantages of a sub-sampling PLL such as low in-band phase noise and reference spur. Also, the phase settling time of the the sub-sampling PLL 100 may be independent of the initial phase error. Still further, the sub-sampling PLL 100 may support multi-phase and single phase VCOs. This is enabled by the multi-edge reference clock sampling used for single phase VCOs working at high frequencies. The sub-sampling PLL 100 may operate with very low in-band phase noise, linear phase characteristics and with constant gain in phase detection. The sub-sampling phase detector block 109 may provide infinite frequency locking range and infinite frequency capture range, and may be an ideal solution for very high frequency clocks in a range greater than or equal to 10 GHZ-30 GHz.

As noted previously, embodiments of the inventive concepts have been described in terms of blocks which carry out a described function or functions. These blocks, which may be referred to herein as units or modules or the like, may be implemented in software for execution by various types of processors. An identified module of computer readable program code may, for instance, comprise one or more physical or logical blocks of computer instructions, which may, for instance, be organized as an object, procedure, or function. Where a module or portions of a module are implemented in software, the computer readable program code may be stored and/or propagated on or in one or more computer readable medium(s). The computer readable medium may be a tangible computer readable storage medium storing the computer readable program code. The computer readable storage medium may be, for example, but not limited to, an electronic, magnetic, optical, electromagnetic, infrared, holographic, micromechanical, or semiconductor system, apparatus, or device, or any suitable combination of the foregoing. The computer readable medium may also be a computer readable signal medium. A computer readable signal medium may include a propagated data signal with computer readable program code embodied therein, for example, in baseband or as part of a carrier wave. Such a propagated signal may take any of a variety of forms, including, but not limited to, electrical, electro-magnetic, magnetic, optical, or any suitable combination thereof.

While some example embodiments have been particularly shown and described, it should be understood by one of ordinary skill that variations in form and detail may be made without departing from the spirit and scope of the claims.

We claim:

1. A sub-sampling phase lock loop comprising:
   a plurality of samplers configured to:
      receive a plurality of clock signal phases corresponding to a clock signal generated by a voltage controlled oscillator,
      receive a plurality of reference signal phases of a reference signal generated by a reference clock generator, and
      obtain a plurality of sampled values by sampling the plurality of clock signal phases generated by the voltage controlled oscillator at sampling edges of the plurality of reference signal phases over a reference clock cycle of the reference signal;
   a phase detector configured to:
      select a phase for a particular instant kTref of the reference signal based on at least one sampled value satisfying a predetermined criteria, said phase corresponding to a clock signal phase value and a reference signal phase value respectively selected out of the plurality of clock signal phases and the plurality of reference signal phases, where "k" refers to a numbering of the particular instant,
      track the selected phase at every successive instant (k+1)Tref of the reference signal, and
      determine sampled values associated with the selected phase in the every successive instant (k+1)Tref of the reference signal at every instant of the reference clock cycle; and
   a processing unit configured to:
      acquire frequency information at the every successive instant (k+1)Tref based on the tracking of the selected phase,
      wherein the acquired frequency information comprises:
      a frequency offset value determined based on a differential between the sampled values within a successor instant (k+1)Tref of the reference signal and the sampled values in the particular instant kTref of the reference signal, and
      a direction traversed by the selected phase between the particular instant kTref and successor instant (k+1)Tref.

2. The sub-sampling phase lock loop of claim 1, wherein the acquired frequency information is derived by averaging the acquired frequency information over reference clock cycles corresponding to a k+N number, wherein N is an integer number.

3. The sub-sampling phase lock loop of claim 1, wherein the phase detector, while selecting the phase in a pair of phases within the particular instant kTref and tracking the selected phase in every successive instant (k+1)Tref of the reference clock cycle, is configured to:
   evaluate the sampled values and the determined sampled value as meeting the predefined criteria linked with a shape of a waveform underlying the clock signal from the voltage controlled oscillator, wherein one phase corresponds to a phase of the voltage controlled oscillator and another phase corresponds to a phase of the reference clock cycle.

4. The sub-sampling phase lock loop of claim 1, wherein the sampled values and the determined sampled value correspond to a linear phase response curve in accordance with linear phase frequency detection based characteristics.

5. The sub-sampling phase lock loop of claim 2, wherein the processing unit is configured to obtain the frequency offset value by:
   determining a magnitude of a phase offset between the particular instant kTref and the successor instant (k+1)Tref based on a correlation of the sampled values and the determined sampled values, and thereby obtaining a differential between the sampled values and the determined sampled values,
   determining a time interval between the particular instant kTref and the successor instant (k+1)Tref of the reference signal, and
   obtaining the frequency offset value based on a ratio of the phase offset and the time interval, over a time interval of the reference clock cycles corresponding to the number N.

6. The sub-sampling phase lock loop of claim 1, wherein the processing unit is configured to obtain the direction traversed by the selected phase between the particular instant kTref and the successor instant (k+1)Tref by:
   identifying a movement of the selected phase between the particular instant kTref and the successor instant (k+1)Tref of the reference signal in at least one of a clockwise or an anti-clockwise movement of the selected phase; and
   indicating an identified direction of the movement of the selected phase as a direction of the frequency offset.

7. The sub-sampling phase lock loop of claim 5, wherein the processing unit is configured to obtain the direction traversed by the selected phase between the particular instant kTref and successor instant (k+1)Tref by identifying a movement of the selected phase between the particular instant kTref and the successor instant (k+1)Tref of the reference signal based on a sign associated with the magnitude of the phase offset; and
   indicating an identified sign as a direction of the frequency offset.

8. The sub-sampling phase lock loop of claim 4, wherein the phase detector is configured in accordance with a user-defined linear region to select the phase for the particular instant kTref, the successive instants (k+1)Tref of the reference signal, and the sampled values, wherein the user-defined linear region is based on a power/resolution parameter associated with the sub-sampling phase lock loop.

9. The sub-sampling phase lock loop of claim 8, wherein a number of the plurality of clock signal phases of the clock signal and/or a number of the plurality of reference signal phases of the reference signal is based on the power/resolution parameter associated with the sub-sampling phase lock loop.

10. The sub-sampling phase lock loop of claim 1, wherein the processing unit is configured to control the voltage controlled oscillator based on the frequency offset value.

11. The sub-sampling phase lock loop of claim 1, wherein the plurality of the sampled values is a set of sampled values N, wherein the set of sampled values N is obtained at specific time instants corresponding to at least one of rising sampling edges or falling sampling edges of the plurality of reference signal phases, wherein the set of sampled values N is evaluated at corresponding N instants of the reference clock cycle and N is an integer value.

12. The sub-sampling phase lock loop of claim 5, wherein the phase offset and the frequency offset define instantaneous values that are determined over a time interval of the reference clock cycles corresponding to an k+M number, and M is an integer number, and
the processing unit is further configured to determine a mean value of the phase offset and a mean value of the frequency offset,
wherein the averaged acquired frequency information corresponds to the mean value of the phase offset and the mean value of the frequency offset.

13. A sub-sampling phase lock loop comprising:
a plurality of samplers configured to:
receive a plurality of clock signal phases corresponding to a clock signal generated by a voltage controlled oscillator,
receive a plurality of reference signal phases of a reference signal generated by a reference clock generator, and
obtain a plurality of sampled values by sampling the plurality of clock signal phases generated by the voltage controlled oscillator by sampling edges of the plurality of reference signal phases over a reference clock cycle of the reference signal;
a phase detector configured to:
select a phase for a particular instant kTref of the reference signal based on at least one sampled value satisfying a predetermined criteria, said phase corresponding to a clock signal phase value and a reference signal phase value respectively selected out of the plurality of clock signal phases and the plurality of reference signal phases,
track the selected phase at every successive instant (k+1)Tref of the reference signal, and
determine sampled values associated with the selected phase in the successive instant (k+1)Tref of the reference signal at every instant of the reference clock cycle; and
a processing unit configured to:
determine frequency information at the every successive instant (k+1)Tref based on the tracking of the selected phase across the particular instant kTref and one or more successive instants (k+1)Tref, . . . (k+n)Tref of the reference signal, where "k" refers to a numbering of the particular instant and "k+n" refers to a numbering of a last successive instant, and wherein said determined frequency information is based on at least one of
a number of phases of the plurality of clock signal phases output by the voltage controlled oscillator,
a number of the plurality of reference signal phases output by the reference clock generator, and
a number of instants of the reference signal starting from the particular instant kTref till the last successive instant (k+1)Tref, . . . (k+n)Tref of the reference signal.

14. A method of sub-sampling phase detection in a sub-sampling phase lock loop, the method comprising:
obtaining, by a plurality of samplers, a plurality of sampled values by sampling a plurality of clock signal phases generated by a voltage controller oscillator using sampling edges of a plurality of reference signal phases generated by a reference clock generator for a reference clock cycle;

selecting a phase for a particular instant kTref of a reference signal based on at least one sampled value satisfying a predetermined criteria, said phase corresponding to a clock signal phase value and a reference signal phase value respectively selected out of the plurality of clock signal phases and the plurality of reference signal phases, where "k" refers to a numbering of the particular instant;
tracking the selected phase at every successive instant (k+1)Tref of the reference signal;
determining sampled values associated with the selected phase in the every successive instant (k+1)Tref of the reference signal at every instant of the reference clock cycle; and
acquiring, using a processing unit, frequency information at the every successive instant (k+1)Tref based on the tracking of the selected phase,
wherein the acquired frequency information comprises:
a frequency offset value determined based on a differential between the sampled values within a successor instant (k+1)Tref of the reference signal and the sampled values in the particular instant (kTref) of the reference signal, and
a direction traversed by the selected phase between the particular instant kTref and the successor instant (k+1) Tref.

15. The method of claim 14, wherein the acquired frequency information is derived by averaging the acquired frequency information over reference clock cycles corresponding to an k+N number, wherein N is an integer number.

16. The method of claim 14, wherein while the selecting of the phase in a pair of phases within the particular instant kTref and the tracking of the selected phase in every successive instant (k+1)Tref of the reference clock cycle, the method comprising:
evaluating the sampled values and the determined sampled value as meeting the predefined criteria linked with a shape of a waveform underlying a clock signal from the voltage controlled oscillator, wherein one phase corresponds to a phase of the voltage controlled oscillator and another phase corresponds to a phase of the reference clock cycle.

17. The method of claim 14, wherein the sampled values and the determined sampled value correspond to a linear phase response curve in accordance with a linear phase frequency detector (PFD) based characteristics.

18. The method as claimed in claim 15, wherein the frequency offset value is obtained by:
determining a magnitude of a phase offset between the particular instant kTref and the successor instant (k+1) Tref based on a correlation of the sampled values and the determined sampled values, and thereby obtaining a differential between the sampled values and the determined sampled values;
determining a time interval between the particular instant kTref and the successor instant (k+1)Tref of the reference signal; and
obtaining the frequency offset value based on a ratio of the phase offset and the time interval, over a time interval of the reference clock cycles corresponding to the number N.

19. The method of claim 15, wherein the direction traversed by the selected phase between the particular instant kTref and the successor instant (k+1) Tref is obtained by:
identifying a movement of the selected phase between the particular instant kTref and the successor instant (k+1)

Tref of the reference signal in at least one of a clockwise or an anti-clockwise movement of the selected phase; and indicating an identified direction of the movement of the selected phase as a direction of the frequency offset.

20. The method of claim 18, wherein the direction traversed by the selected phase between the particular instant kTref and successor instant (k+1)Tref is obtained by:

identifying a movement of the selected phase between the particular instant kTref and the successor instant (k+1)Tref of the reference signal based on a sign associated with the magnitude of the phase offset; and indicating an identified sign as a direction of the frequency offset.

* * * * *